United States Patent
Jeong et al.

(10) Patent No.: US 11,362,682 B2
(45) Date of Patent: *Jun. 14, 2022

(54) ENCODING METHOD AND APPARATUS USING CRC CODE AND POLAR CODE

(71) Applicants: Samsung Electronics Co., Ltd., Suwon-si (KR); SUNGKYUNKWAN UNIVERSITY RESEARCH & BUSINESS FOUNDATION, Suwon-si (KR)

(72) Inventors: Hongsil Jeong, Suwon-si (KR); Sang-Hyo Kim, Seoul (KR); Jong-Hwan Kim, Suwon-si (KR); Daehyeon Ryu, Seongnam-si (KR); Seho Myung, Seoul (KR)

(73) Assignees: Samsung Electronics Co., Ltd., Suwon-si (KR); Sungkyunkwan University Research & Business Foundation, Suwon-si (KR)

( * ) Notice: Subject to any disclaimer, the term of this patent is extended or adjusted under 35 U.S.C. 154(b) by 32 days.

This patent is subject to a terminal disclaimer.

(21) Appl. No.: 16/901,606

(22) Filed: Jun. 15, 2020

(65) Prior Publication Data

US 2020/0313698 A1  Oct. 1, 2020

Related U.S. Application Data

(63) Continuation of application No. 15/457,293, filed on Mar. 13, 2017, now Pat. No. 10,686,473, which is a
(Continued)

(30) Foreign Application Priority Data

Dec. 14, 2012 (KR) .......................... 10-2012-0146359

(51) Int. Cl.
*H04L 1/00* (2006.01)
*H03M 13/09* (2006.01)
(Continued)

(52) U.S. Cl.
CPC .... *H03M 13/2915* (2013.01); *H03M 13/1575* (2013.01); *H03M 13/2906* (2013.01);
(Continued)

(58) Field of Classification Search
CPC .. H03M 13/13; H03M 13/09; H03M 13/2915; H03M 13/1575; H03M 13/2906; H04L 1/0061; H04L 1/0041
See application file for complete search history.

(56) References Cited

U.S. PATENT DOCUMENTS 6,233,289 B1    5/2001  Fredrickson
8,812,898 B1 *  8/2014  Lahon ................ G06F 11/1443
                                                          714/4.2
(Continued)

FOREIGN PATENT DOCUMENTS

EP        2 426 822 A1    3/2012

OTHER PUBLICATIONS

Bin Li et al., An Adaptive Successive Cancellation List Decoder for Polar Codes with Cyclic Redundancy Check, IEEE Communications Letters, Dec. 12, 2012, vol. 16, Issue 12.
(Continued)

*Primary Examiner* — Guy J Lamarre
(74) *Attorney, Agent, or Firm* — Jefferson IP Law, LLP

(57) ABSTRACT

An encoding method for encoding input information bits using an encoder implemented with concatenation of a CRC-α coder and a polar coder is provided. The method includes performing Cyclic Redundancy Check (CRC) coding on as many information bits as a determined number of CRC coding bits among input information bits and performing polar coding on the CRC-coded information bits and other information bits than the CRC-coded information bits.

20 Claims, 13 Drawing Sheets

Related U.S. Application Data continuation of application No. 14/106,021, filed on Dec. 13, 2013, now Pat. No. 9,628,113.

(51) Int. Cl.
*H03M 13/13* (2006.01)
*H03M 13/15* (2006.01)
*H03M 13/29* (2006.01)
*H03M 13/00* (2006.01)

(52) U.S. Cl.
CPC .......... *H04L 1/0041* (2013.01); *H04L 1/0061* (2013.01); *H03M 13/09* (2013.01); *H03M 13/13* (2013.01)

(56) References Cited

U.S. PATENT DOCUMENTS

| | | | | |
|---|---|---|---|---|
| 9,628,113 | B2* | 4/2017 | Jeong | H04L 1/0041 |
| 10,686,473 | B2* | 6/2020 | Jeong | H03M 13/1575 |
| 2002/0178419 | A1* | 11/2002 | Wilhelmsson | H03M 13/09 |
| | | | | 714/755 |
| 2004/0264592 | A1 | 12/2004 | Sibecas et al. | |
| 2009/0164704 | A1* | 6/2009 | Kanade | G06F 11/1068 |
| | | | | 711/E12.001 |
| 2009/0265513 | A1* | 10/2009 | Ryu | G06F 3/0679 |
| | | | | 711/149 |
| 2010/0122141 | A1* | 5/2010 | Arye | H04L 47/18 |
| | | | | 714/752 |
| 2011/0276856 | A1* | 11/2011 | Litsyn | H03M 13/2927 |
| | | | | 714/752 |
| 2012/0155565 | A1 | 6/2012 | Wiley | |
| 2014/0003552 | A1 | 1/2014 | Kolze | |
| 2014/0019820 | A1 | 1/2014 | Vardy et al. | |
| 2014/0153654 | A1 | 6/2014 | Vojcic et al. | |
| 2014/0365842 | A1 | 12/2014 | Li et al. | |
| 2015/0103947 | A1 | 4/2015 | Shen et al. | |

OTHER PUBLICATIONS

Bonick, Gregory, A variant of list plus CRC concatenated polar code, Information Theory (cs.IT), arXiv:1207.466 [cs. IT], Jul. 19, 2012.

Kai Niu et al., CRC-Aided Decoding of Polar Codes, IEEE Communications Letters, Oct. 10, 2012, vol. 16, Issue 10.

* cited by examiner

ENCODING METHOD AND APPARATUS USING CRC CODE AND POLAR CODE

CROSS-REFERENCE TO RELATED APPLICATION(S)

This application is a continuation application of prior application Ser. No. 15/457,293, filed on Mar. 13, 2017, which is a continuation application of prior application Ser. No. 14/106,021, filed on Dec. 13, 2013, which has issued as U.S. Pat. No. 9,628,113 on Apr. 18, 2017, and claimed priority under 35 U.S.C § 119(a) of a Korean patent application number 10-2012-0146359, filed on Dec. 14, 2012, in the Korean Intellectual Property Office, the disclosure of which is incorporated by reference herein in its entirety.

JOINT RESEARCH AGREEMENT

The present disclosure was made by or on behalf of the below listed parties to a joint research agreement. The joint research agreement was in effect on or before the date the present disclosure was made and the present disclosure was made as a result of activities undertaken within the scope of the joint research agreement. The parties to the joint research agreement are 1) SAMSUNG ELECTRONICS CO., LTD. and 2) SUNGKYUNKWAN UNIVERSITY RESEARCH & BUSINESS FOUNDATION.

TECHNICAL FIELD

The present disclosure relates to a method for encoding input information bits using an encoder implemented with concatenation of a Cyclic Redundancy Check (CRC)-α coder and a polar coder.

BACKGROUND

In a wireless communication system, the link capacity decreases significantly due to various noises, a fading effect, an Inter-Symbol Interference (ISI), and the like. Therefore, technologies have been developed to overcome the noises, fading, and ISI and to implement a high speed digital communication system with high data processing capability and reliability, such as a next generation mobile communication, digital broadcasting, mobile Internet services, and the like. Recently, many researches have been conducted on the error-correcting code as a method of compensating for distortion of information so as to improve communication reliability.

The Cyclic Redundancy Check (CRC) code is added to the data of the transport block for use in error detection at the recipient, and the polar code is an error correction code developed by Arikan in 2009 and proved to be able to achieve the channel capacity of binary-input memoryless symmetric channel theoretically.

Although the polar code is the code operating independently without concatenation with the CRC code, it is possible to obtain large error rate performance gain by concatenating the polar code with the CRC code as compared to its independent use when using the Successive Cancellation List (SCL) decoder for decoding the polar code. According to the research conducted so far, by encoding with the CRC code and the polar code concatenation and decoding with the SCL decoder, it is possible to obtain the best performance close to the performance of turbo Low Density Parity Check (LDPC) code.

Therefore, a need exists for a method for improving error rate performance by applying a CRC code efficiently when a short CRC code length causes error floor phenomenon in an encoder implemented by concatenating a CRC-α coder and a polar coder.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method for improving error rate performance by applying a Cyclic Redundancy Check (CRC) code efficiently when a short CRC code length causes error floor phenomenon in an encoder implemented by concatenating a CRC-α coder and a polar coder.

In accordance with an aspect of the present disclosure, an encoding method is provided. The method includes performing CRC coding on as many information bits as a determined number of CRC coding bits among input information bits and performing polar coding on the CRC-coded information bits and other information bits than the CRC-coded information bits.

In accordance with another aspect of the present disclosure, an encoding apparatus is provided. The encoding apparatus includes a CRC coder configured to perform CRC coding on as many information bits as a determined number of CRC coding bits among input information bits and a polar coder configured to perform polar coding on the CRC-coded information bits and other information bits than the CRC-coded information bits.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
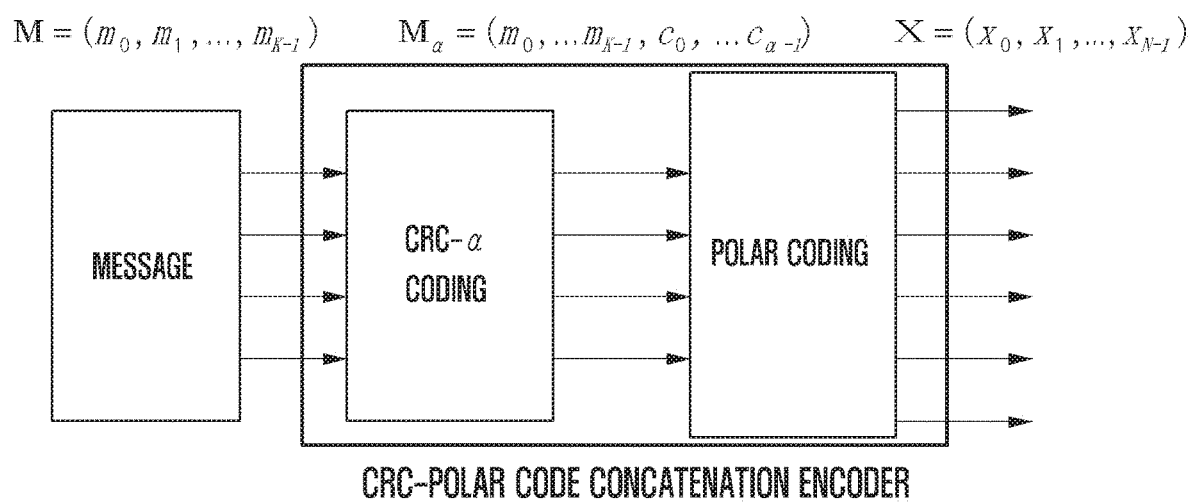
FIG. 1 is a diagram illustrating a structure of a Cyclic Redundancy Check (CRC)-polar code concatenation encoder according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide.

Some elements are exaggerated, omitted, or simplified in the drawings and the elements may have sizes and/or shapes different from those shown in drawings, in practice. The same reference numbers are used throughout the drawings to refer to the same or like parts.

Prior to describing embodiments of the present disclosure, descriptions are made of a Cyclic Redundancy Check (CRC)-α coder and a polar coder and Successive Cancellation List (SCL) decoder corresponding thereto. The encoder implemented by concatenating the CRC-α coder and polar coder is referred to as CRC-polar code concatenation encoder.

FIG. 1 is a diagram illustrating a structure of a CRC-polar code concatenation encoder according to an embodiment of the present disclosure.

Referring to FIG. 1, M, $M_\alpha$, and X are all binary row vectors consisting of 0's and 1's. M denotes the input of the CRC-polar concatenation encoder and has a length of K, and X denotes the output of the CRC-polar concatenation encoder and has a length of N, wherein $N=2^n$, n is a natural number, and N>K. Here, M is the information bits to be transmitted by the transmitter and X is the codeword obtained by encoding M. In the case of FIG. 1, the effective coding rate R of the CRC-polar concatenation encoder is K/N. As shown in FIG. 1, the CRC-polar concatenation encoder is implemented by concatenating the CRC coder and the polar coder that are described hereinafter.

The input of the CRC-α coder is M consisting of K bits, and the output of the CRC-α coder is $M_\alpha$ consisting of K+α bits. The CRC-α coder performs encoding on the input M to generate a binary parity vector $C=(c_0, c_1, \ldots, c_{\alpha-1})$ based on a given CRC code generator polynomial and concatenates C with M to generate $M_{60}$.

The input of the polar coder is $M_\alpha$ consisting of K+α bits, and the output of the polar coder is X consisting of N bits. The symbols used for describing the polar coder are defined as in Table 1.

TABLE 1

| Symbol | Description |
| --- | --- |
| $G_N$ | N × N size polar code generator matrix, and $N = 2^n$ Defined as $G_N = B_N F^{\otimes n}$. $B_N$ is Bit-reversal matrix having N × N size which has been proposed by Arikan, and $$F = \begin{bmatrix} 1 & 0 \\ 1 & 1 \end{bmatrix}, \otimes n \text{ is } nth \text{ order Kronecker product operation.}$$ $G_N^{Non} = F^{\otimes n}$ may also be used as a polar code generator matrix. $B_N$ matrix is described with an example afterward. The present disclosure is directed to the case of using $G_N$ as the polar code generator matrix, and $G_N^{Non}$ also can be sued as the generator matrix. |
| I | information set of polar code set having size of K + α and subset of {0, 1, 2, ..., N − 1}. I is a set generated based on channel polarization phenomenon and description of generating I is omitted. |
| $G_N(I)$ | polar code partial generator matrix having size of (K + α) × N for all i ∈ I, partial generator matrix consisting of $(i + 1)^{th}$ rows of matrix $G_N$ |
| U(I) | U is row vector $U = (u_0, u_1, \ldots, u_{N-1})$ having size of N × 1 defined as $U(I) = (u_i; i \in I)$ and partial vector of U order of elements in U(I) vector follow order of elements in U vector |

All polar coders having a code length N can be expressed with generator matrix $G_N(I)$. The polar coder for the information set I of size K+α is expressed by Equation (1).

$$M_\alpha \times G_N(I) = X \quad \text{Equation (1)}$$

Since $M_\alpha$ is a row vector of size K+α and the partial generator matrix $G_N(I)$ has size (K+α)×N, X is a binary vector of size N×1.

The operation of the polar coder may be exemplified as follows. Assuming N=8, $G_8$ of size 8×8 matches the left one of two matrices below. For reference, the right matrix is $G_8^{Non}$ that can be obtained by rearranging the rows of $G_8$ in bit-reversal order, and $G_8$ can be obtained by rearranging the rows of $G_8^{Non}$ in bit-reversal order.

$$G_8 = \begin{bmatrix} 1 & 0 & 0 & 0 & 0 & 0 & 0 & 0 \\ 1 & 0 & 0 & 0 & 1 & 0 & 0 & 0 \\ 1 & 0 & 1 & 0 & 0 & 0 & 0 & 0 \\ 1 & 0 & 1 & 0 & 1 & 0 & 1 & 0 \\ 1 & 1 & 0 & 0 & 0 & 0 & 0 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix} \quad G_8 = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

The rows are rearranged in bit-reversal order as follows. First, the first to last rows of matrix $G_8^{Non}$ are assigned the indices from 0 to 7 in series. Since N=8, the index is binary-expanded to (000), (001), (010), (011), (100), (101), (110), and (111).

If the first and last bits of the indices are interchanged while maintaining the row index order, this results in (000), (100), (010), (110), (001), (101), (011), and (111). These binary expansion values are converted to 0, 4, 2, 6, 1, 5, 3, and 7. For example, the matrix $G_8$ is obtained by rearranging the rows of matrix $G_8^{Non}$ in the order of row indices 0, 4, 6, 1, 5, 3, and 7. Similarly, matrix $G_8^{Non}$ is obtained by rearranging the rows of matrix $G_8$ in the bit-reversal order.

An embodiment of the present disclosure is directed to the case of $G_8$ of the two matrices. A partial generator matrix $G_8(I)$ is determined depending on the size and elements of a set I in matrix $G_8$. If K+α=4 and I={3, 5, 6, 7} ('I' denotes the information set of polar code), the rows of the matrix $G_8$ that are used to generate the partial generator matrix $G_8(I)$ are the rows of values obtained by adding 1 to the respective elements of I. For example, the $4^{th}$, $6^{th}$, $7^{th}$, and $8^{th}$ rows are used to form the matrix $G_8(I)$ of size 4×8 as follows.

$$G_8(I) = \begin{bmatrix} 1 & 0 & 1 & 0 & 1 & 0 & 1 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix}$$

K+α information bits are polar-coded with the matrix $G_8(I)$, and this process can be expressed as Equation (2), wherein $b_i$ denotes information bit.

$$(b_0 \ b_1 \ b_2 \ b_3) \times G_8(I) = \\ (x_0 \ x_1 \ x_2 \ x_3 \ x_4 \ x_5 \ x_6 \ x_7) = \\ \begin{pmatrix} b_0+b_1+b_2+b_3 & b_0+b_2+b_3 & b_0+b_1+b_3 & b_0+b_3 \\ b_1+b_2+b_3 & b_2+b_3 & b_1+b_3 & b_3 \end{pmatrix} \quad \text{Equation (2)}$$

Figure 2:
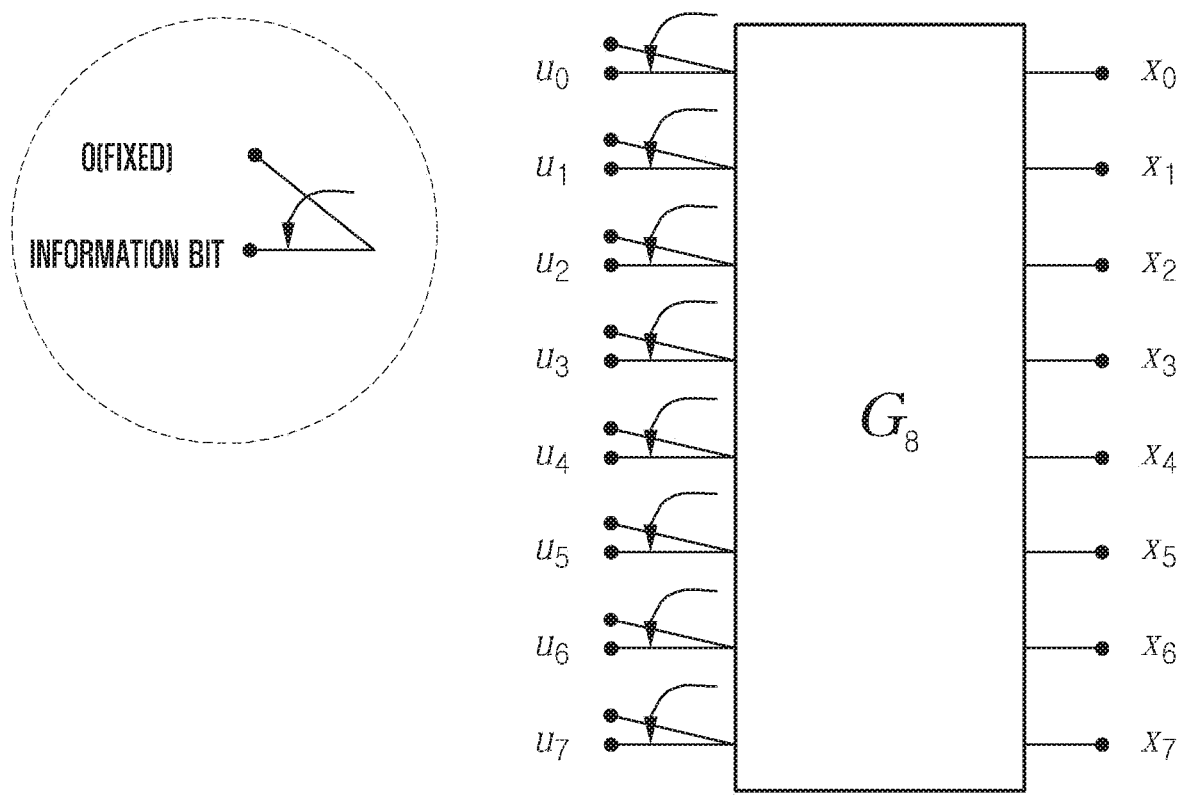
FIG. 2 is a diagram illustrating a polar coder according to an embodiment of the present disclosure.

FIG. 2 is a diagram illustrating a polar coder according to an embodiment of the present disclosure.

Referring to FIG. 2, the right part illustrates a polar coder using $G_8$. The polar coder has 8 inputs U=($u_0, u_1, \ldots, u_7$) at its left side and 8 outputs at its right side. However, each element of U operates as a switch switching between a fixed mode for inputting a fixed value and an information bit mode for inputting an information bit. In FIG. 2, the fixed value is 0.

As described above, if I={3, 5, 6, 7}, the fixed value of 0 is input through U($I^c$)=($u_0, u_1, u_2, u_4$) and the information bits are input through other positions of U(I)=($u_3, u_5, u_6, u_7$). The four information bits are mapped to $u_3, u_5, u_6$, and $u_7$ one to one. Defining the 1:1 relationship between the information bits and U(I) is not restricted and, in the present disclosure, it is assumed that $i^{th}$ element of $M_\alpha$ and $i^{th}$ element of U(I) are mapped one to one.

A description is made of the SCL decoder considered in the present disclosure.

The SCL decoder is proposed by Tal and Vardy in 2011 and improves the polar code Successive Cancellation (SC) decoding performance. More particularly, the SCL decoder shows enhanced performance when concatenating the CRC code and polar code as compared to the case without concatenation. Descriptions are made of the operations of the SCL decoder with and without concatenation of the CRC code and polar code hereinafter.

In the case of the polar code without concatenation with the CRC code, the SCL decoder generates L codeword candidates with the receive signal vector. A set of L codeword candidates is referred to as a list, and one codeword having the highest likelihood from the list is selected.

In the case of the polar code concatenated with the CRC code, the SCL decoder generates L codeword candidates with the received signal vector, performs CRC check on all the codeword candidates included in the list, and selects one codeword having the highest likelihood among the erroneous codeword candidates.

As described above, it is important to determine the CRC code length α matching various code lengths or various code rates of the polar code in the CRC-polar code concatenation encoder. If α is too long to transmit too many non-information bits, this causes performance degradation due to the coding rate loss and, otherwise, if α is too short to increase the error detection failure probability, this causes performance degradation. As a result, it is important to use the CRC code having a suitable length α according to the polar code length N and the coding rate R.

Figure 3:
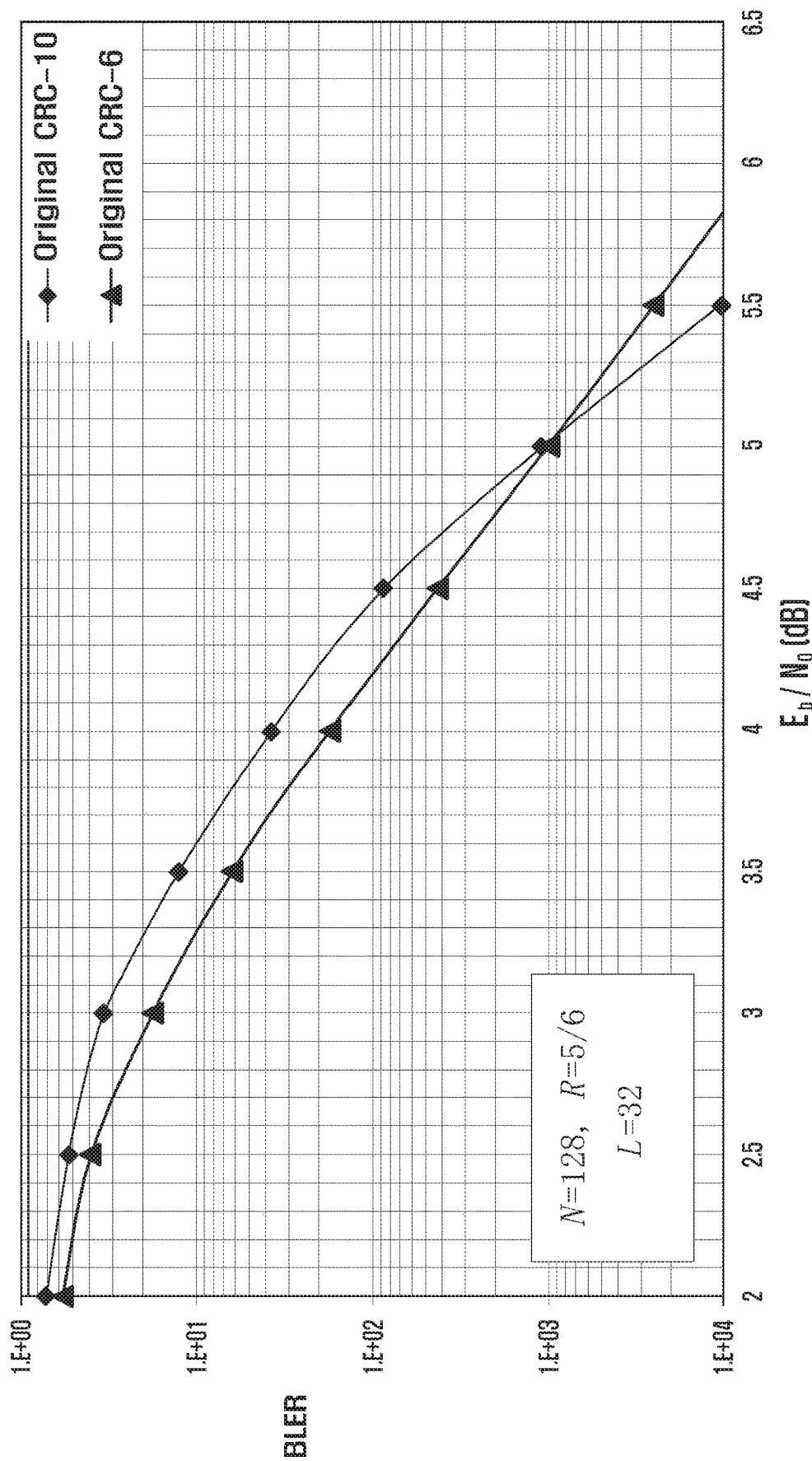
FIG. 3 is a graph illustrating performance of a CRC-polar concatenation system according to an embodiment of the present disclosure.

FIG. 3 is a graph illustrating performance of a CRC-polar concatenation system according to an embodiment of the present disclosure.

Referring to FIG. 3, y axis denotes the block error rate performance, and x axis denotes $E_b/N_0$(dB). The code length of the polar code is N=128, code rate is R=5/6, and code length of the SCL decoder is L=32. The two codes compared in FIG. 3 are generated with the same partial generator matrix $G_N(I)$ but with different α values of 6 and 10. In FIG. 3, the code having α=6 is represented by original CRC-6, and the code having α=10 is represented by original CRC-10.

Referring to FIG. 3, the original CRC-6 code shows superior performance at low $E_b/N_0$ (dB) and, as the $E_b/N_0$ (dB) increases, the CRC-6 performance degrades to be lower than that of the original CRC-10.

The performance slope of the code with α=6 is more gentle than that of the code with α=10, and this is an unavoidable feature of the CRC code. The reason why the error rate performance slope is gentle with the short length CRC code is because the probability of failing detection of the erroneous codeword among the codeword candidates in the list is high. The reason for the high probability of error detection failure is because too many information bits are CRC-coded as compared to the length of the CRC code.

Accordingly, the present disclosure aims to improve the error rate performance by applying CRC coding efficiently in the case where the short CRC code length causes the error floor phenomenon, i.e., the phenomenon in which the error rate reduction slope becomes gentle.

Figure 4:
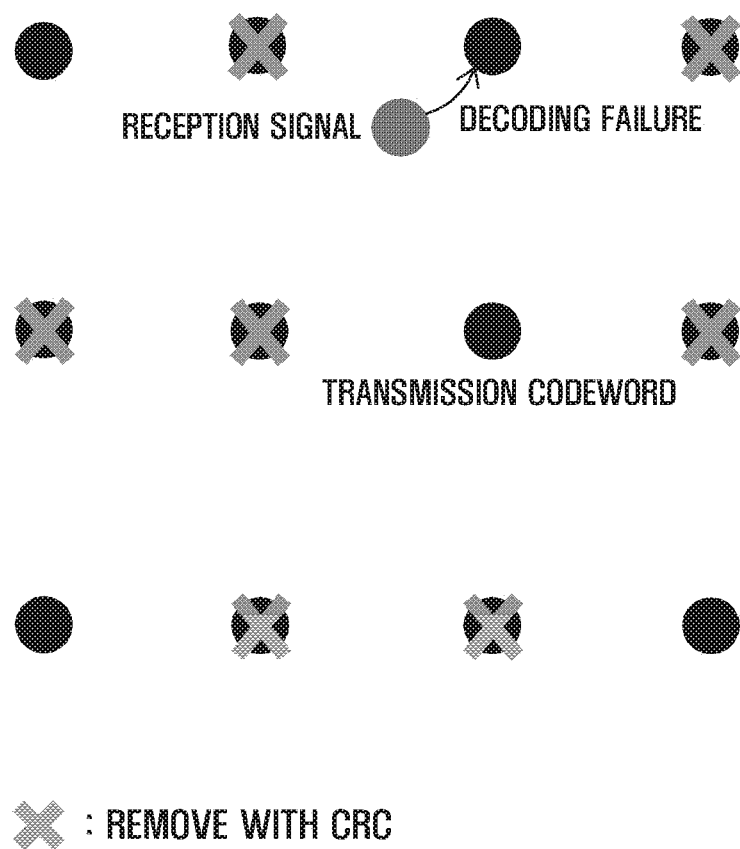
FIG. 4 is a diagram illustrating a Successive Cancellation List (SCL) decoding procedure when applying CRC coding according to the related art.

FIG. 4 is a diagram illustrating a SCL decoding procedure when applying CRC coding according to the related art.

Referring to FIG. 4, the reason for applying CRC coding to the entire K information bits is to make it possible for the receiver to remove all codewords that are not transmitted with the CRC code in CRC error detection process. Accordingly, if the CRC code length is not long enough as compared to the number of information bits, this causes the error floor. As shown in FIG. 4, if the receiver fails to remove the codewords that are not transmission codewords among 12 codewords candidates in the list due to insufficient length of CRC code, it increases the decoding failure probability.

Figure 5:
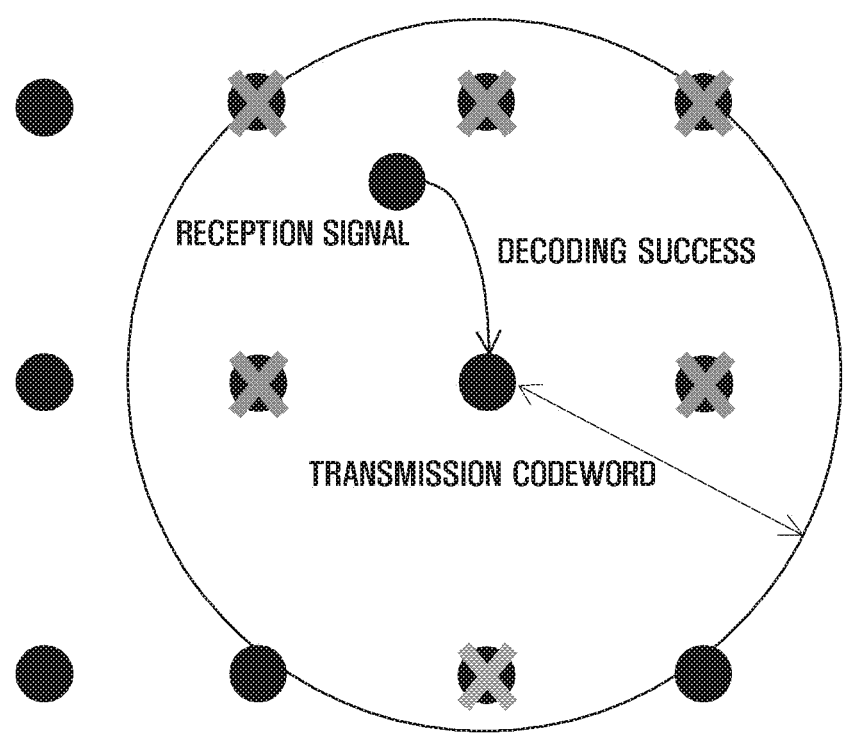
FIG. 5 is a diagram illustrating a SCL decoding procedure when applying CRC coding according to an embodiment of the present disclosure.

FIG. 5 is a diagram illustrating a SCL decoding procedure when applying CRC coding according to an embodiment of the present disclosure.

Referring to FIG. 5, a method for removing codewords close to the transmission codeword using the CRC code is illustrated. More particularly, FIG. 5 illustrates a CRC coding method capable of removing codewords in the range d of Hamming Distance from the transmission codeword while adjusting the value of parameter d. In order to accomplish this, the CRC coding is applied to some bits of K information bits other than all of K information bits.

A description is made of the encoding method according to an embodiment of the present disclosure hereinafter.

As aforementioned, the encoding method according to an embodiment of the present disclosure applies the CRC coding to $\beta$ ($0<\beta<K$) information bits among K information bits unlike the method of the related art in which the CRC coding is applied to all of K information bits. Here, $\beta$ is determined depending on $G_N(I)$ determined at the CRC-polar concatenation encoder and d.

More specifically, $\beta$ is determined based on the following parameters.

N: length of polar code
I: information set of polar code and having size K+$\alpha$.
d: maximum Hamming distance from transmission codeword error-detection available with CRC-$\alpha$ code.
$\alpha$: length of CRC code.
$G_N(I)$: polar code partial generator matrix of size (K+$\alpha$)×N $$G_N(I) = \begin{bmatrix} 1 & \cdots & 0 & 0 \\ 1 & \ddots & 1 & 0 \\ \vdots & 0 & \ddots & \vdots \\ 1 & \cdots & 1 & 1 \end{bmatrix}$$

The polar coding may be expressed with matrix $G_N(I)$. For example, all polar coders having the code length N and coding rate R can be expressed by matrix $G_N(I)$.

When $G_N(I)$ and d are given, a number of rows of which Hamming weight is equal to or less than d is $\beta+\alpha$ among the rows of $G_N(I)$. Here, the Hamming weight of a row denotes a number of non-zero elements in the row. Accordingly, $\beta$ is the value obtained by subtracting $\alpha$ from a number of rows of which Hamming weight is equal to or less than d.

The method for obtaining $\beta$ can be applied if $G_N$ is given regardless of whether the polar code generator matrix is $G_N$ or $G_N^{Non}$. In addition, although only the information set I is given, it is possible to obtain $\beta$ independently of matrix $G_N(I)$. The method of obtaining $\beta$ through I is the method of being applicable identically regardless of whether the polar code generator matrix is $G_N$ or $G_N^{Non}$.

When $N=2^n$ and information set I, d, and $\alpha$ are given, $\beta$ can be obtained as follows.

First, it is required to obtain the n-bit binary expansion vector for $i\in I$. The binary vector corresponding to each i is defined as $B_i$. Thereafter, a number of 1's in $B_i$ for all $i\in I$, the number of i's in which number of 1's is equal to or less than $\log_2 d$ is counted to $\beta+\alpha$. In this way, $\beta$ can be obtained. At this time, a set of i's in which a number of 1's is equal to or less than $\log_2 d$ for all $i\in I$ is defined as $I_d$.

For example, when N=8 and information set I={3, 5, 6, 7}, d=4, and $\alpha$=2 are given, $\beta$ can be obtained as follows.

The 3-bit binary expansion vector for all $i\in I$ is obtained as follows.

$$B_3=(0\ 1\ 1), B_5=(1\ 0\ 1), B_6=(1\ 1\ 0), B_7=(1\ 1\ 1)$$

After obtaining the number of 1's included in $B_i$ for all $i\in I$, the number of i's in which the number of 1's is equal to or less than $\log_2 4$ is 3. Accordingly, $\beta$ is obtained as $\beta=3-\alpha=3-2=1$.

After obtaining $\beta$ as described above, the CRC coding is applied to the $\beta$ bits among K information bits.

Figure 6:
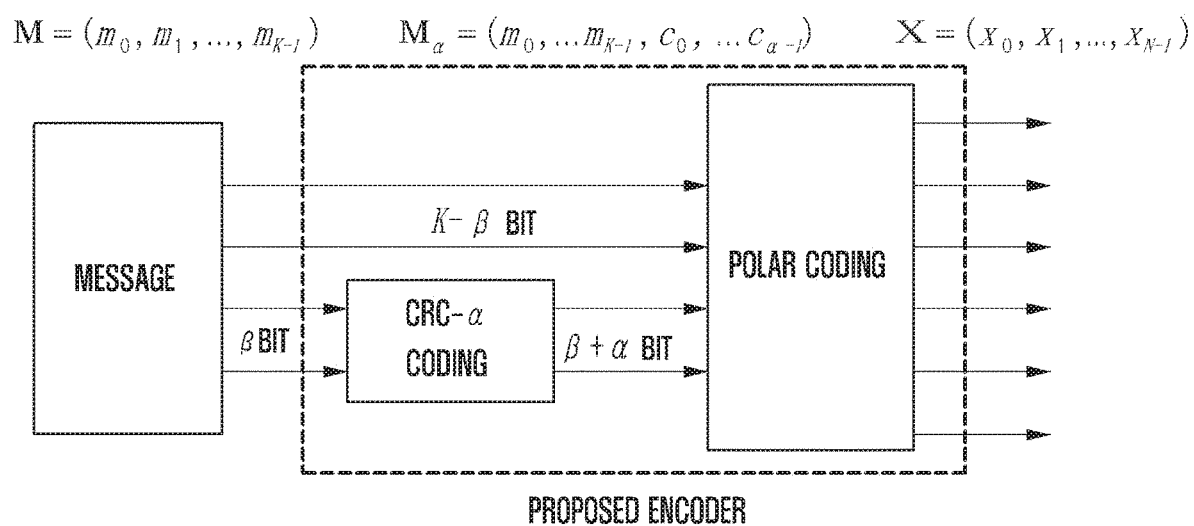
FIG. 6 is a block diagram illustrating a configuration of a CRC-polar code concatenation encoder according to an embodiment of the present disclosure.

FIG. 6 is a block diagram illustrating a configuration of a CRC-polar code concatenation encoder according to an embodiment of the present disclosure.

Referring to FIG. 6, the CRC coding is applied to $\beta$ bits among K input information bits, and the polar coding is applied to $\beta+\alpha$ CRC-coded bits and K-$\beta$ non-CRC coded bits.

Figure 7:
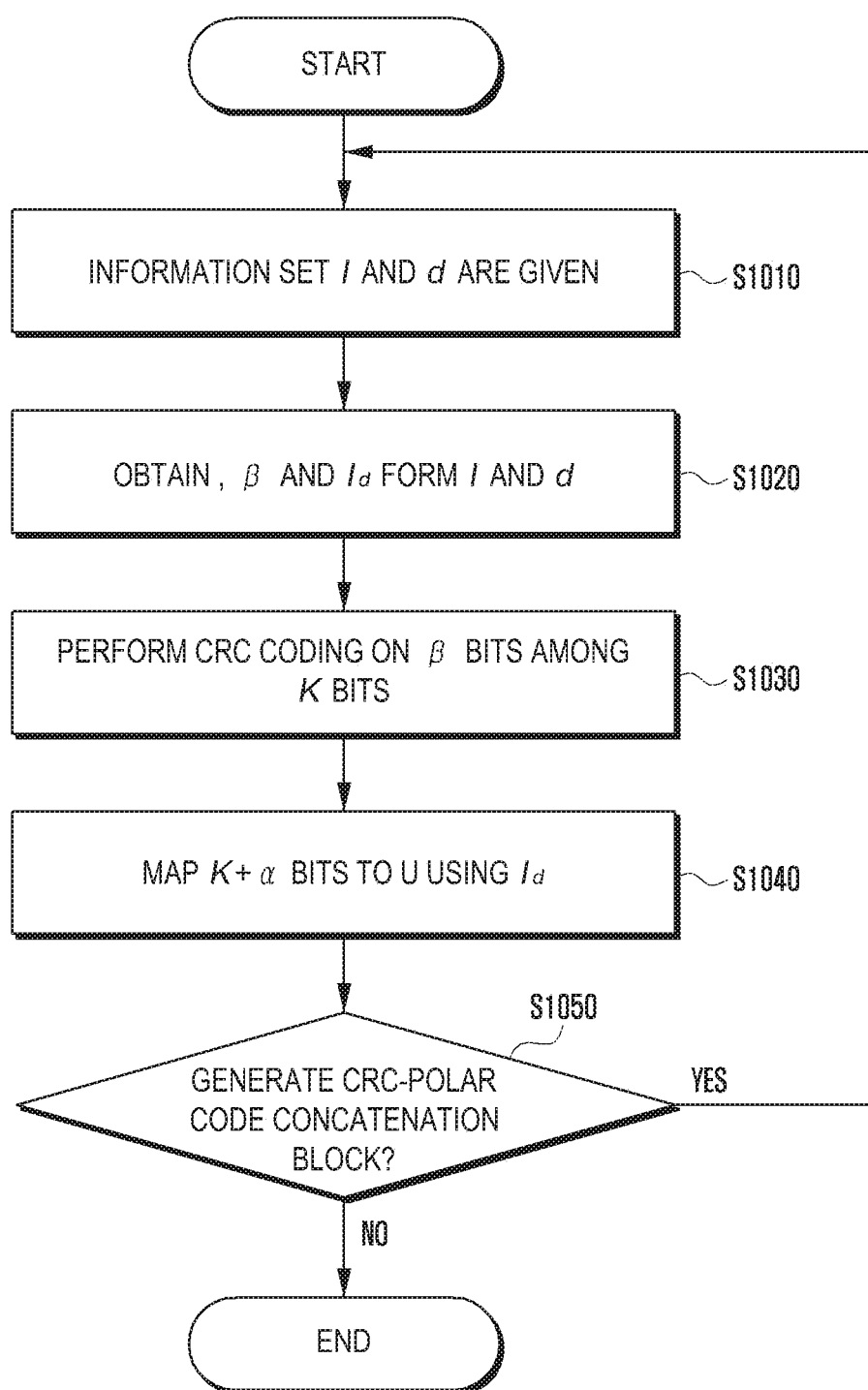
FIG. 7 is a flowchart illustrating a procedure of CRC coding and polar coding in an encoding method according to an embodiment of the present disclosure.

FIG. 7 is a flowchart illustrating a procedure of CRC coding and polar coding in an encoding method according to an embodiment of the present disclosure.

Referring to FIG. 7, the information set I of the polar code and parameter d are given in advance at operation S1010. Thereafter, $\beta$ and $I_d$ are obtained from the given I and parameter d through the above described method at operation S1020. This operation is described hereinafter.

Figure 8:
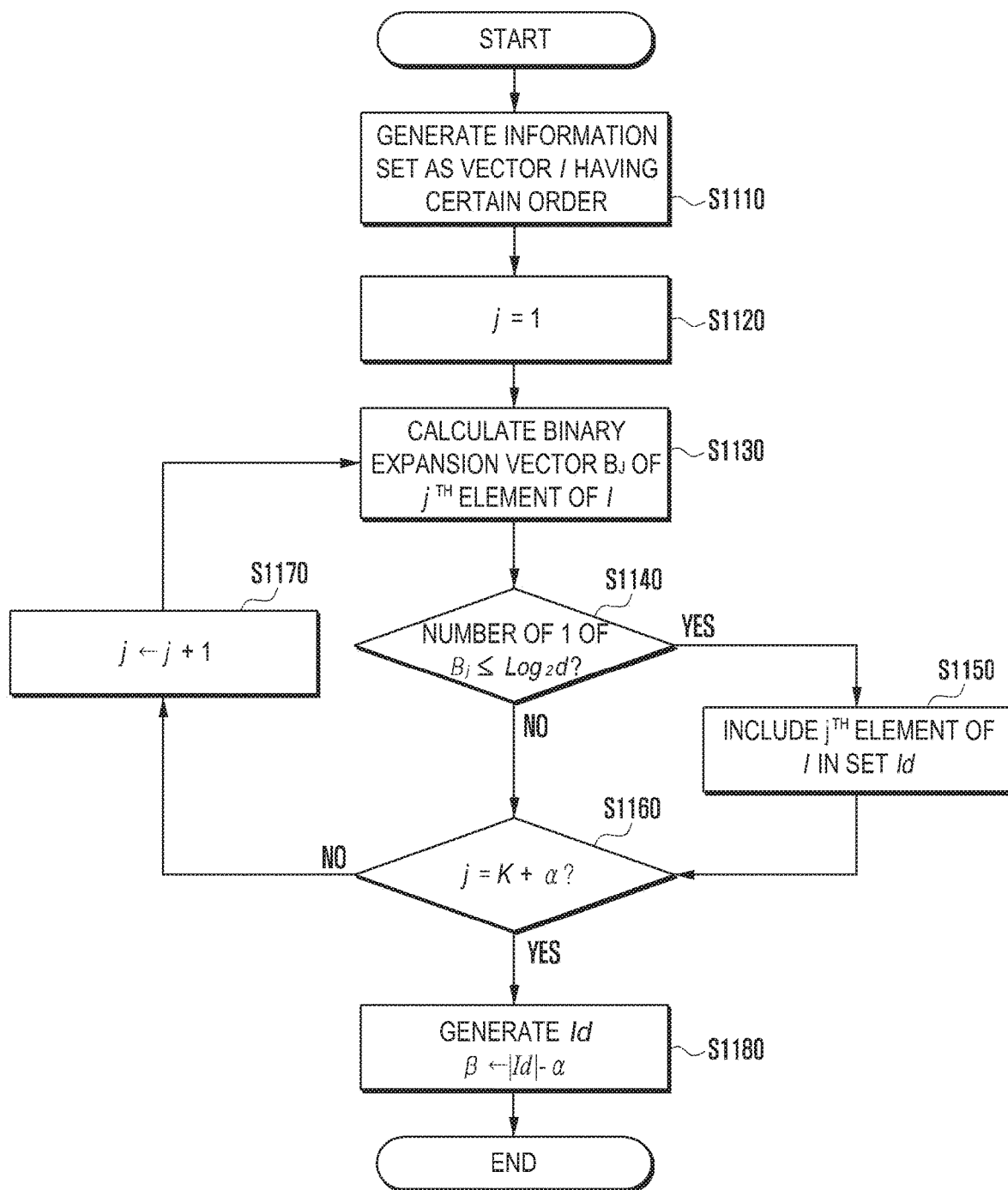
FIG. 8 is a flowchart illustrating a procedure of calculating β as a number of bits to be CRC-coded in an encoding method according to an embodiment of the present disclosure.

FIG. 8 is a flowchart illustrating a procedure of calculating $\beta$ as a number of bits to be CRC-coded in an encoding method according to an embodiment of the present disclosure.

Referring to FIG. 8, the information set I is processed to generate a vector I having a certain order at operation S1110 and an initial value j=1 is set at operation S1120.

Thereafter, a binary expansion vector $B_j$ of $j^{th}$ element of I is calculated at operation S1130, and it is determined whether a number of 1's included in $B_j$ is equal to or less than $\log_2 d$ at operation S1140. If number of 1's included in $B_j$ is equal to or less than $\log_2 d$, the $j^{th}$ element of I is included in the set $I_d$ at operation S1150.

It is determined whether j is equal to K+$\alpha$ at operation S1160. For example, it is determined whether the above described process has been applied to all elements of the information set and, if j does not reach the K+$\alpha$ yet, j is incremented by 1 at operation S1170 to calculate the binary expansion vector $B_j$ and repeats the above described operations. If the above described process has been applied to all elements of the information set, a set $I_d$ is generated and $|I_d|-\alpha$ is determined as $\beta$ at operation S1180.

Returning back to FIG. 7, the CRC coding is performed on $\beta$ information bits among the entire K input information bits at operation S1030. At this time, $\beta$ bits to which CRC coding is applied may be selected randomly among K information bits, e.g., $\beta$ bits from the first element of M corresponding to K information bits in sequence.

At operation S1040, the polar coding is performed to map K+α bits to U using $I_d$. A description is made of the polar coding procedure hereinafter.

Figure 9:
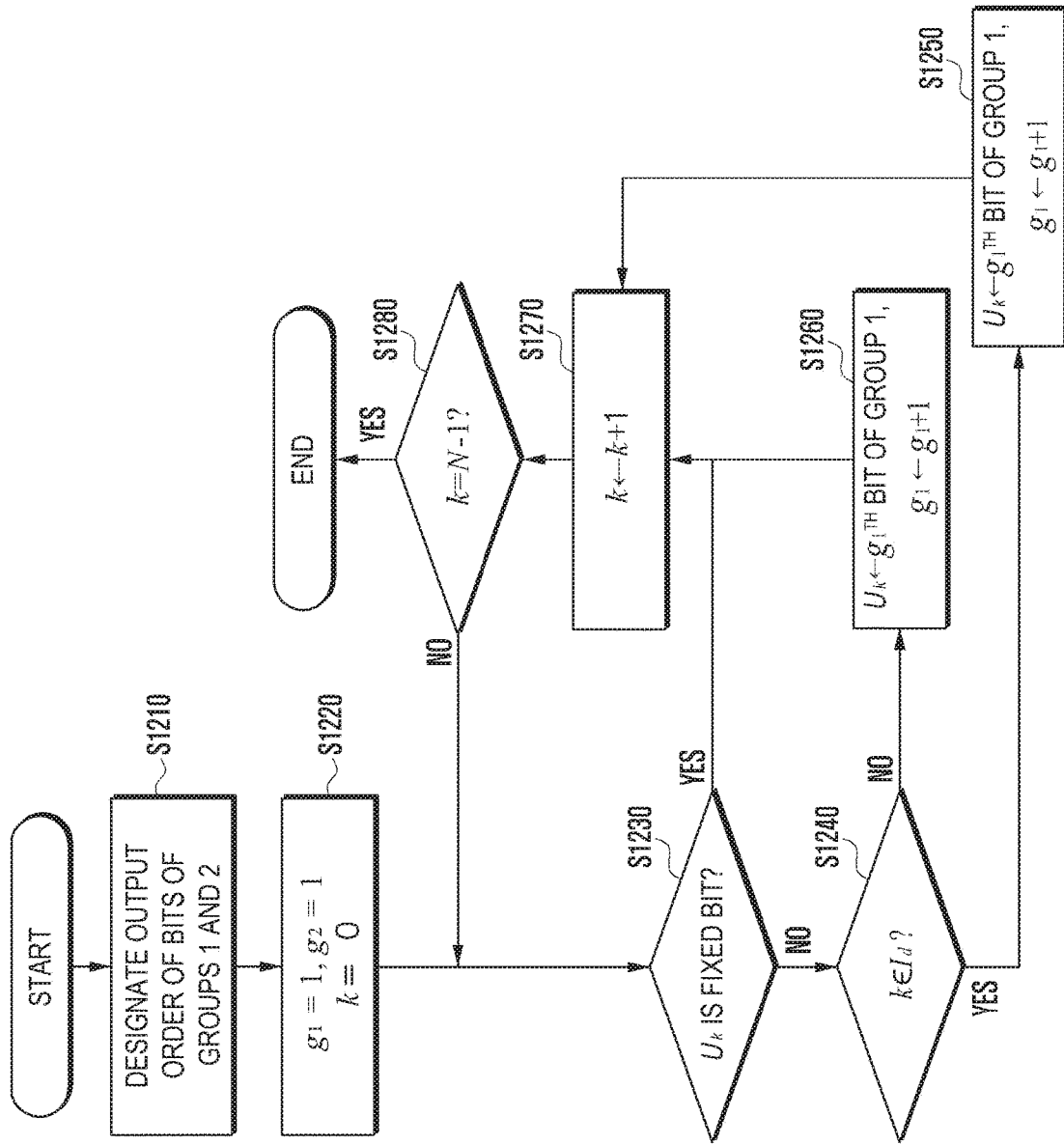
FIG. 9 is a flowchart illustrating a polar coding procedure of an encoding method according to an embodiment of the present disclosure.

FIG. 9 is a flowchart illustrating a polar coding procedure of an encoding method according to an embodiment of the present disclosure.

Referring to FIG. 9, the K+α bits $M_α$ input to the polar coder are sorted into β+α bits passed the CRC-α coder and K-β bits bypassed the CRC-α coder. The β+α bits are sorted into group 1, and the K-β bits are sorted into group 2. The bits of group 1 that are CRC-coded are mapped to $U(I_d)$ one to one at the polar coder, and the bits of group 2 are mapped to $U(I-I_d)$ one to one. Here, the mapping may be defined randomly.

The output order of groups 1 and 2 are designated at operation S1210. The output order may be determined under the assumption that the bits of each group are stacked or queued.

The initial values of parameters for polar coding are set as follows at operation S1220.

$$g_1=1, g_2=1, k=0$$

Whether $u_k$ is a fixed bit is determined at operation S1230 and, if it is a fixed bit, whether k belongs to $I_d$ is determined at operation S1240. If k belongs to $I_d$, $g_1$ of group 1 is mapped to $u_k$ and is incremented by 1 at operation S1250. If k does not belong to $I_d$, $g_2$ bit of group 2 is mapped to $u_k$ and incremented by 1 at operation S1260.

If operations S1250 and S1260 are performed or if it is determined that $u_k$ is a fixed bit, k is incremented by 1 at operation S1270, and at operation S1280, it is determined whether k has reached N-1. If it is determined at operation S1280 that k has not reached N-1, the procedure goes to operation S1230 to repeat the above operations. If it is determined at operation S1280 that k has reached N-1, the polar coding procedure ends.

Returning back to FIG. 7, if a CRC-polar code concatenation block is generated at operation S1050, the encoding procedure ends.

Figure 10:
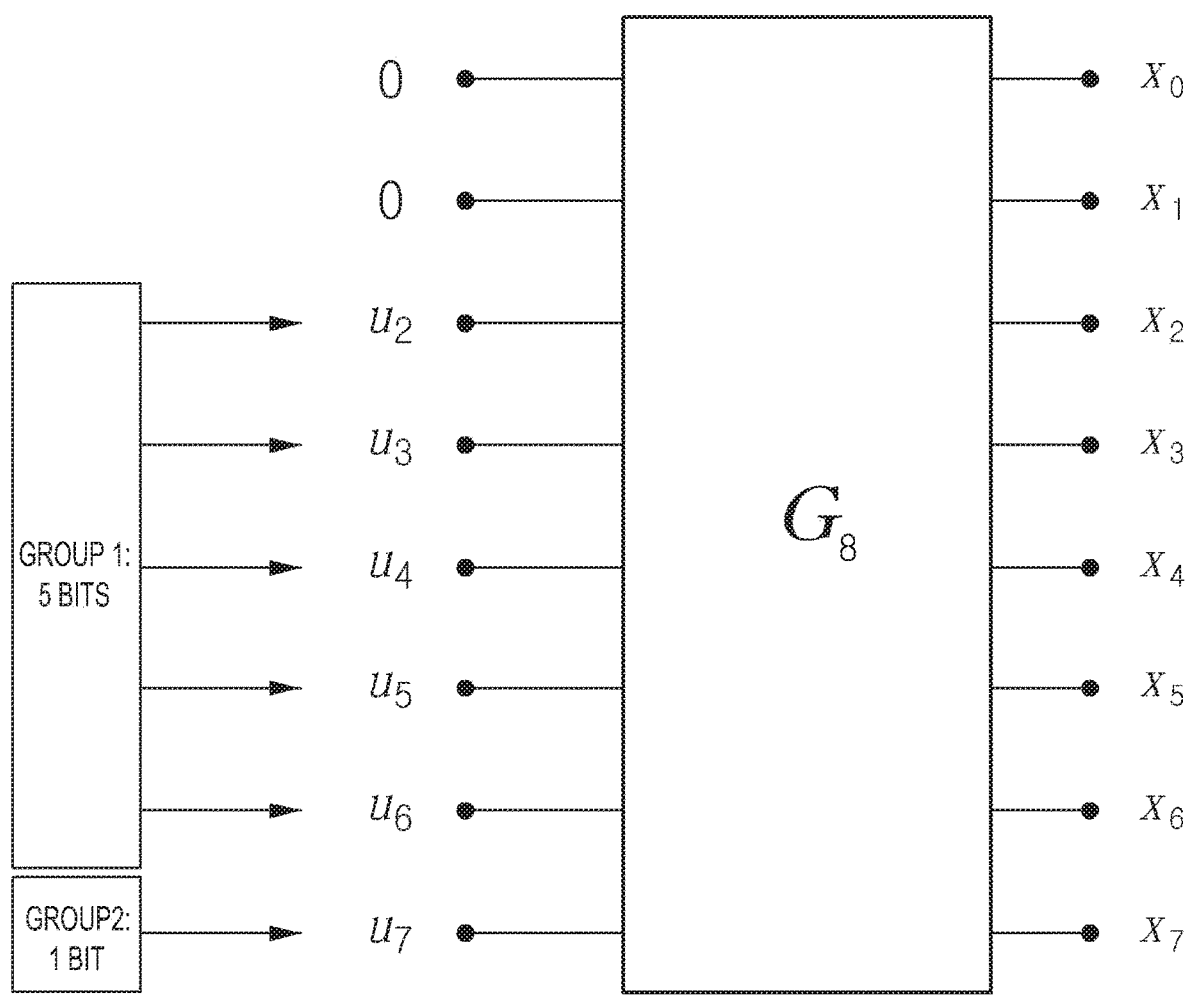
FIG. 10 is diagram illustrating one-to-one mapping relationship between polar coder input bits and U vector according to an embodiment of the present disclosure.

FIG. 10 is diagram illustrating one-to-one mapping relationship between polar coder input bits and U vector according to an embodiment of the present disclosure.

Returning to FIG. 10, a description is made of the encoding procedure when the following conditions are given for the bit-reversal matrix $G_8$ according to an embodiment of the present disclosure.

$$N = 8, k = 4, \alpha = 2, D = 4, i = \{2, 3, 4, 5, 6, 7\}$$

$$G_8 = \begin{bmatrix} 1 & 0 & 0 & 0 & 0 & 0 & 0 & 0 \\ 1 & 0 & 0 & 0 & 1 & 0 & 0 & 0 \\ 1 & 0 & 1 & 0 & 0 & 0 & 0 & 0 \\ 1 & 0 & 1 & 0 & 1 & 0 & 1 & 0 \\ 1 & 1 & 0 & 0 & 0 & 0 & 0 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix}$$

$$G_8(I) = \begin{bmatrix} 1 & 0 & 1 & 0 & 0 & 0 & 0 & 0 \\ 1 & 0 & 1 & 0 & 1 & 0 & 1 & 0 \\ 1 & 1 & 0 & 0 & 0 & 0 & 0 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix}$$

In this embodiment of the present disclosure, since I={2, 3, 4, 5, 6, 7}, $G_8(I)$ is the matrix obtained by removing the first and second rows from matrix $G_8$. Since the number of rows of which Hamming weight is equal to or less than d=4 is 5, β=5−α=3. From the rows of which Hamming weight is equal to or less than d=4, $I_d$={2, 3, 4, 5, 6}.

Since β=3, the three bits selected from the first element of M consisting of 4 information bits in sequence are input to the CRC-2 coder, and the rest one bit is input to the polar coder directly. The 5 bits of group 1 that are output from the CRC-2 coder are mapped to the bits of $U(I_d)$ one to one, and the bits of the group 2 are mapped to the bits of $U(I-I_d)$ one to one. The one-to-one mapping relationship between the bits of groups 1 and 2 and the U vector is depicted in FIG. 10.

Figure 11:
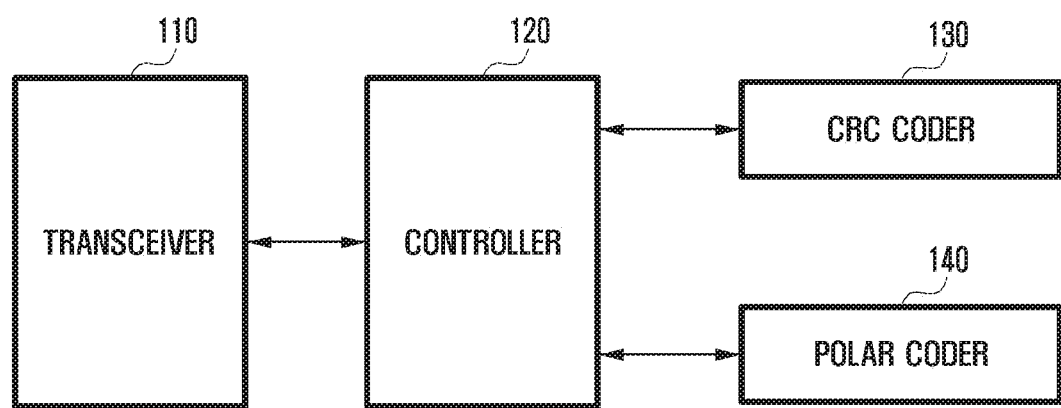
FIG. 11 is a block diagram illustrating a configuration of an encoding apparatus according to an embodiment of the present disclosure.

FIG. 11 is a block diagram illustrating a configuration of an encoding apparatus according to an embodiment of the present disclosure.

Referring to FIG. 11, the encoding apparatus according to an embodiment of the present disclosure includes a transceiver 110, a controller 120, a CRC coder 130, and a polar coder 140.

The transceiver 110 receives the input information bits to be coded and outputs the coded information bits.

The controller 120 controls the coding operations of the CRC coder 130 and the polar coder 140 and calculates parameters used for the coding process. For example, the controller calculates β, i.e., the number of bits to be coded by the CRC coder 130 among the input information bits. The controller 120 also generates $I_d$ to the polar coder 140 such that the group of CRC-coded information bits and the group of non-CRC-coded information bits are mapped to U(I) one to one.

The CRC coder 130 and the polar coder 140 perform CRC coding and polar coding, respectively, as described above under the control of the controller 120.

The performance simulation performed to prove the effect of the present disclosure shows the performance improvement in the case that the length of the CRC code is short as compared to the number of information bits and the most superior performance in the block error rate region applicable to the present disclosure.

Figure 12A:
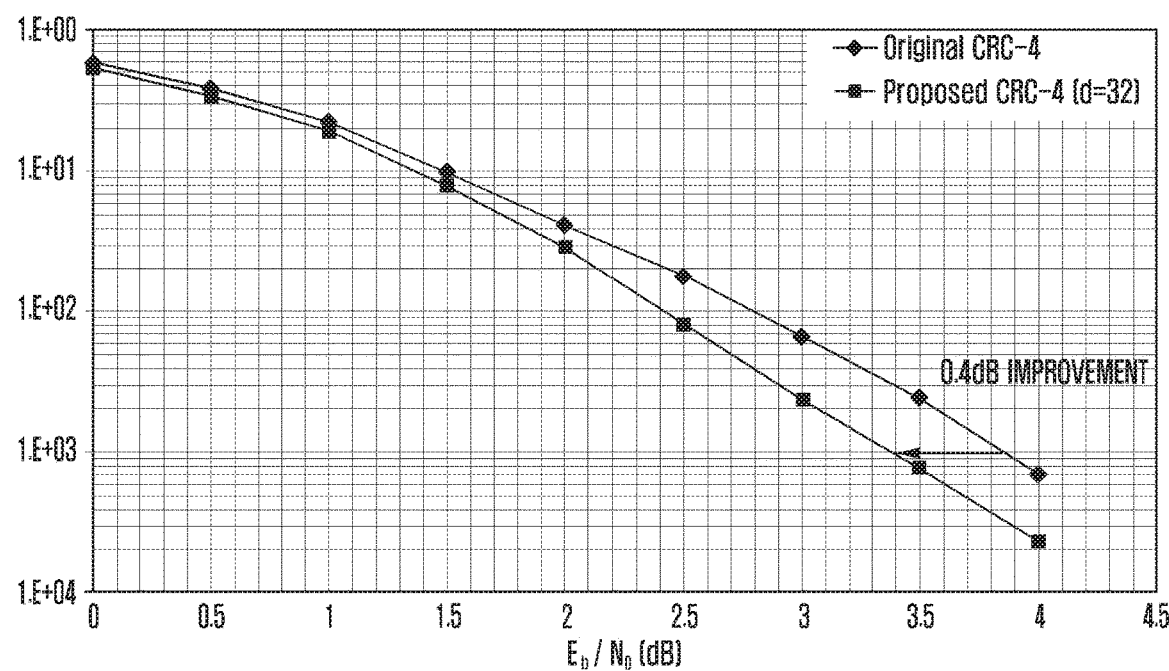
FIGS. 12A and 12B are graphs illustrating performance simulation results of an encoding method when a CRC code length is shorter than a number of information bits according to an embodiment of the present disclosure.
Figure 12B:
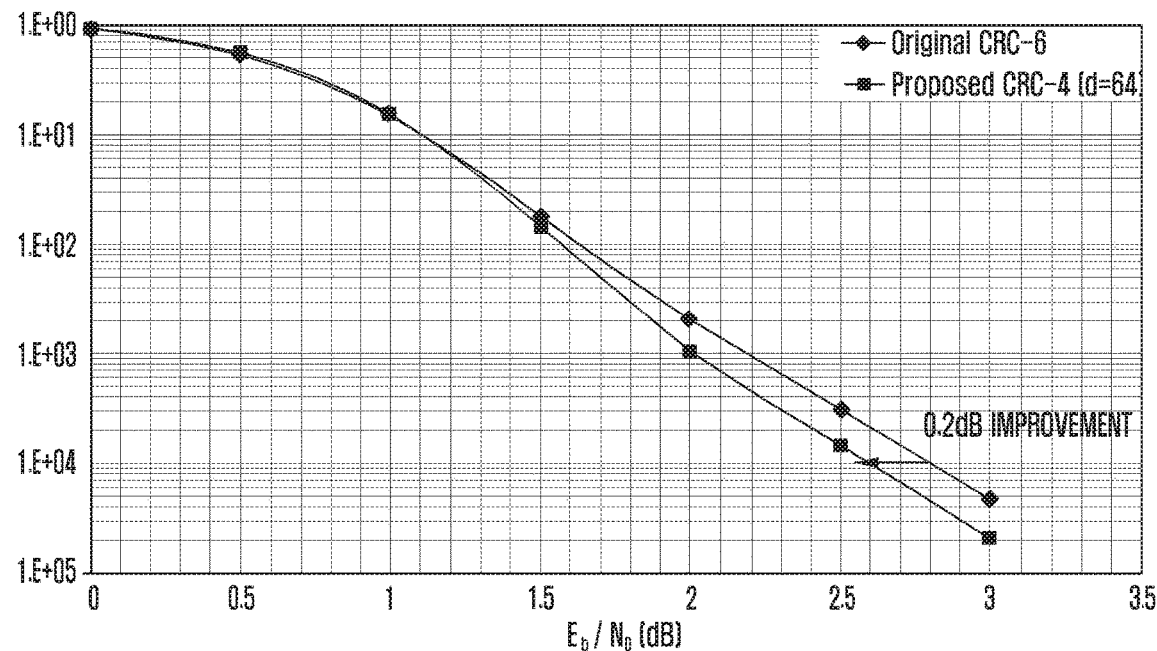

FIGS. 12A and 12B are graphs illustrating performance simulation results of an encoding method when a CRC code length is shorter than a number of information bits according to an embodiment of the present disclosure.

Referring to FIG. 12A, the proposed method obtains the performance gain of about 0.4 dB at the block error rate $10^{-3}$ as compared to the method of the related art under the conditions of N=128, K=64, R=0.5, CRC-4, and d=32.

Referring to FIG. 12B, the proposed method obtains the performance gain of about 0.2 dB at the block error rate $10^{-4}$ as compared to the method of the related art under the conditions of N=1024, K=512, R=0.5, CRC-6, and d=64.

Figure 13:
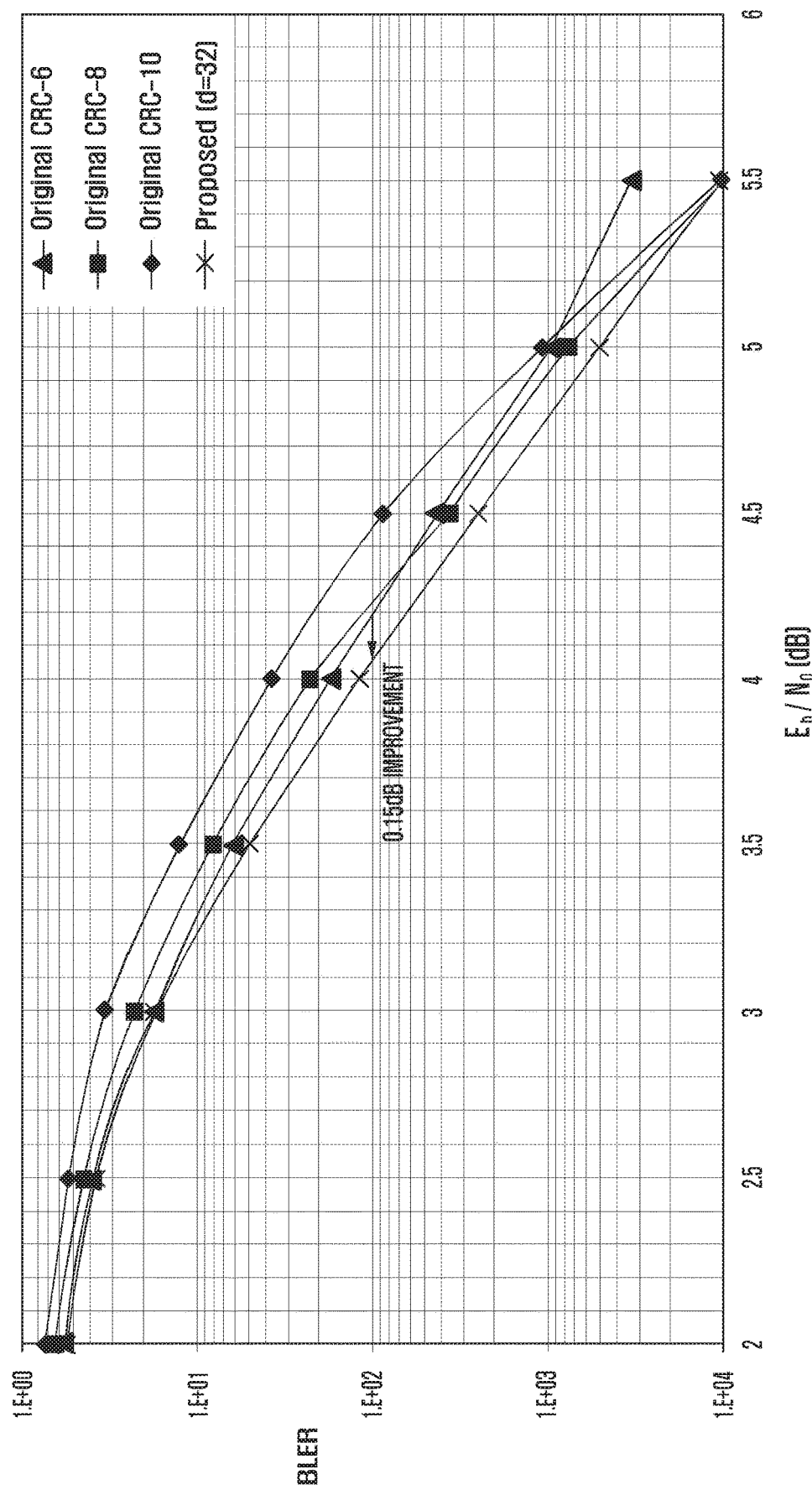
FIG. 13 is a graph illustrating performance simulation result of an encoding method when showing the best performance in a block error rate region regardless of a CRC code length according to an embodiment of the present disclosure.

FIG. 13 is a graph illustrating performance simulation result of an encoding method when showing the best performance in a block error rate region regardless of a CRC code length according to an embodiment of the present disclosure.

Referring to FIG. 13, it is directed to a case where N=128, K=106, R=0.83, and d=32. As shown in FIG. 13, the encoding method according to an embodiment of the present disclosure is an improvement of the method of the related art in performance gain by about 0.15 dB at the block error rate $10^{-2}$. This performance gain is substantial in comparison with the codes different in CRC code length.

The encoding method of the present disclosure is capable of improving the error rate performance of the code causing error floor by performing CRC coding on a part of the input information bits.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method performed by an apparatus in a wireless communication system, the method comprising:
    identifying information bits;
    determining a subset of the information bits to be applied as an error check code among the identified information bits, based on an information set of an error correction code;
    performing an error check coding based on the determined subset of the information bits;
    performing an error correction coding based on the information set of the error correction code, the error check coded subset of the information bits and one or more bits of the identified information bits; and
    transmitting the error correction coded information bits.

2. The method of claim 1, wherein the performing the error correction coding comprises:
    generating output information bits based on the information set of the error correction code, the error check coded subset of the information bits and one or more bits of the identified information bits; and
    obtaining the error correction coded information bits based on the output information bits and a generator matrix.

3. The method of claim 1, wherein a number of the error check coded subset of the information bits is determined based on a number of bits of the information bits.

4. The method of claim 1, wherein the subset of the information bits is determined based on the information set of a polar code and a hamming weight of a raw in a generator matrix.

5. The method of claim 4, wherein the determining of the subset of the information bits comprises:
    generating binary expansion vectors from respective elements of the information set of the polar code;
    calculating a number of elements in which number of 1's included in a corresponding binary vector is equal to or less than a binary log of the hamming weight; and
    determining a value obtained by subtracting a code length determined for the error check coding from the calculated number of elements as a number of bits for the error check coding.

6. The method of claim 1, wherein the error check coding includes a cyclic redundancy check (CRC) coding.

7. The method of claim 1, wherein a number of parity bits of the error check coding is larger than or equal to one.

8. The method of claim 1, wherein the one or more bits are remaining bits, the remaining bits being separate from the determined subset of the information bits.

9. The method of claim 1, wherein the performing of the error check coding comprises:
    selecting as much of the information bits as a number of bits for the error check coding from a first element of the information bits in sequence for the error check coding.

10. The method of claim 1, wherein the performing of the error correction coding comprises:
    mapping the error check coded subset of the information bits to components corresponding to elements of a subset of a polar-coded input vector.

11. An apparatus in a wireless communication system, the apparatus comprising:
    a controller configured to:
        identify information bits,
        determine a subset of the information bits to be applied as an error check code among the identified information bits, based on an information set of an error correction code,
        perform an error check coding based on the determined subset of the information bits,
        perform an error correction coding based on the information set of the error correction code, the error check coded subset of the information bits and one or more bits of the identified information bits, and
        transmit the error correction coded information bits.

12. The apparatus of claim 11, wherein the controller is further configured to:
    generate output information bits based on the information set of the error correction code, the error check coded subset of the information bits and one or more bits of the identified information bits, and
    obtain the error correction coded information bits based on the output information bits and a generator matrix.

13. The apparatus of claim 11, wherein a number of the error check coded subset of the information bits is determined based on a number of bits of the information bits.

14. The apparatus of claim 11, wherein the subset of the information bits is determined based on the information set of a polar code and a hamming weight of a raw in a generator matrix.

15. The apparatus of claim 14, wherein the controller is further configured to:
    generate binary expansion vectors from respective elements of the information set of the polar code,
    calculate a number of elements in which number of 1's included in a corresponding binary vector is equal to or less than a binary log of the hamming weight, and
    determine a value obtained by subtracting a code length determined for the error check coding from the calculated number of elements as a number of bits for the error check coding.

16. The apparatus of claim 11, wherein the error check coding includes a cyclic redundancy check (CRC) coding.

17. The apparatus of claim 11, wherein a number of parity bits of the error check coding is larger than or equal to one.

18. The apparatus of claim 11, wherein the one or more bits are remaining bits, the remaining bits being separate from the determined subset of the information bits.

19. The apparatus of claim 11, wherein the controller is further configured to:
    select as much of the information bits as a number of bits for the error check coding from a first element of the information bits in sequence for the error check coding.

20. The apparatus of claim 11, wherein the controller is further configured to:
    map the error check coded subset of the information bits to components corresponding to elements of a subset of a polar-coded input vector.

* * * * *